(12) United States Patent
Kamtekar et al.

(10) Patent No.: US 11,555,146 B2
(45) Date of Patent: Jan. 17, 2023

(54) FLUORESCENT INFRARED EMITTING COMPOSITION

(71) Applicant: Sumitomo Chemical Company Limited, Tokyo (JP)

(72) Inventors: Kiran Kamtekar, Godmanchester (GB); Daniel Tobjork, Cambridgeshire (GB)

(73) Assignee: Sumitomo Chemical Company Limited, Tokyo (JP)

( * ) Notice: Subject to any disclaimer, the term of this patent is extended or adjusted under 35 U.S.C. 154(b) by 291 days.

(21) Appl. No.: 16/955,758

(22) PCT Filed: Dec. 20, 2018

(86) PCT No.: PCT/GB2018/053719
§ 371 (c)(1),
(2) Date: Jun. 18, 2020

(87) PCT Pub. No.: WO2019/122897
PCT Pub. Date: Jun. 27, 2019

(65) Prior Publication Data
US 2020/0318001 A1    Oct. 8, 2020

(30) Foreign Application Priority Data

Dec. 21, 2017  (GB) ...................... 1721675

(51) Int. Cl.
*H01L 51/50*    (2006.01)
*C09K 11/06*    (2006.01)
*H01L 51/00*    (2006.01)

(52) U.S. Cl.
CPC .......... *C09K 11/06* (2013.01); *H01L 51/0036* (2013.01); *H01L 51/0069* (2013.01); *H01L 51/0074* (2013.01); *C09K 2211/1458* (2013.01); *C09K 2211/1483* (2013.01); *H01L 51/5012* (2013.01)

(58) Field of Classification Search
None
See application file for complete search history.

(56) References Cited

U.S. PATENT DOCUMENTS

2005/0147845 A1  7/2005  Lee et al.
2011/0127509 A1  6/2011  Joo et al.
(Continued)

FOREIGN PATENT DOCUMENTS

WO    WO 2018/008721 A1    1/2018

OTHER PUBLICATIONS

Combined Search and Examination Report for UK Application No. GB 1721675.5, dated Jun. 29, 2018.
(Continued)

*Primary Examiner* — Gregory D Clark
(74) *Attorney, Agent, or Firm* — Wolf, Greenfield & Sacks, P.C.

(57) ABSTRACT

A fluorescent infrared emitting composition comprising a mixture of a first material and a second material wherein the first material is a fluorescent infrared material and the second material is a fluorescent material having a higher photoluminescent quantum yield (PLQY) and shorter peak wavelength than the infrared emitting material. The composition may be used as the light-emitting layer of an organic light-emitting device.

11 Claims, 6 Drawing Sheets

(56) References Cited

U.S. PATENT DOCUMENTS

| | | | |
|---|---|---|---|
| 2013/0037785 A1* | 2/2013 | Fujita | H01L 51/0069 257/E51.026 |
| 2015/0056142 A1 | 2/2015 | Tao et al. | |
| 2016/0359117 A1 | 12/2016 | Hamade et al. | |

OTHER PUBLICATIONS

International Search and Written Opinion for International Application No. PCT/GB2018/053719, dated Mar. 26, 2019.
GB1721675.5, Jun. 29, 2018, Combined Search and Exmanimation Report.
PCT/GB2018/053719, Mar. 26, 2019, International Search Report and Written Opinion.

* cited by examiner

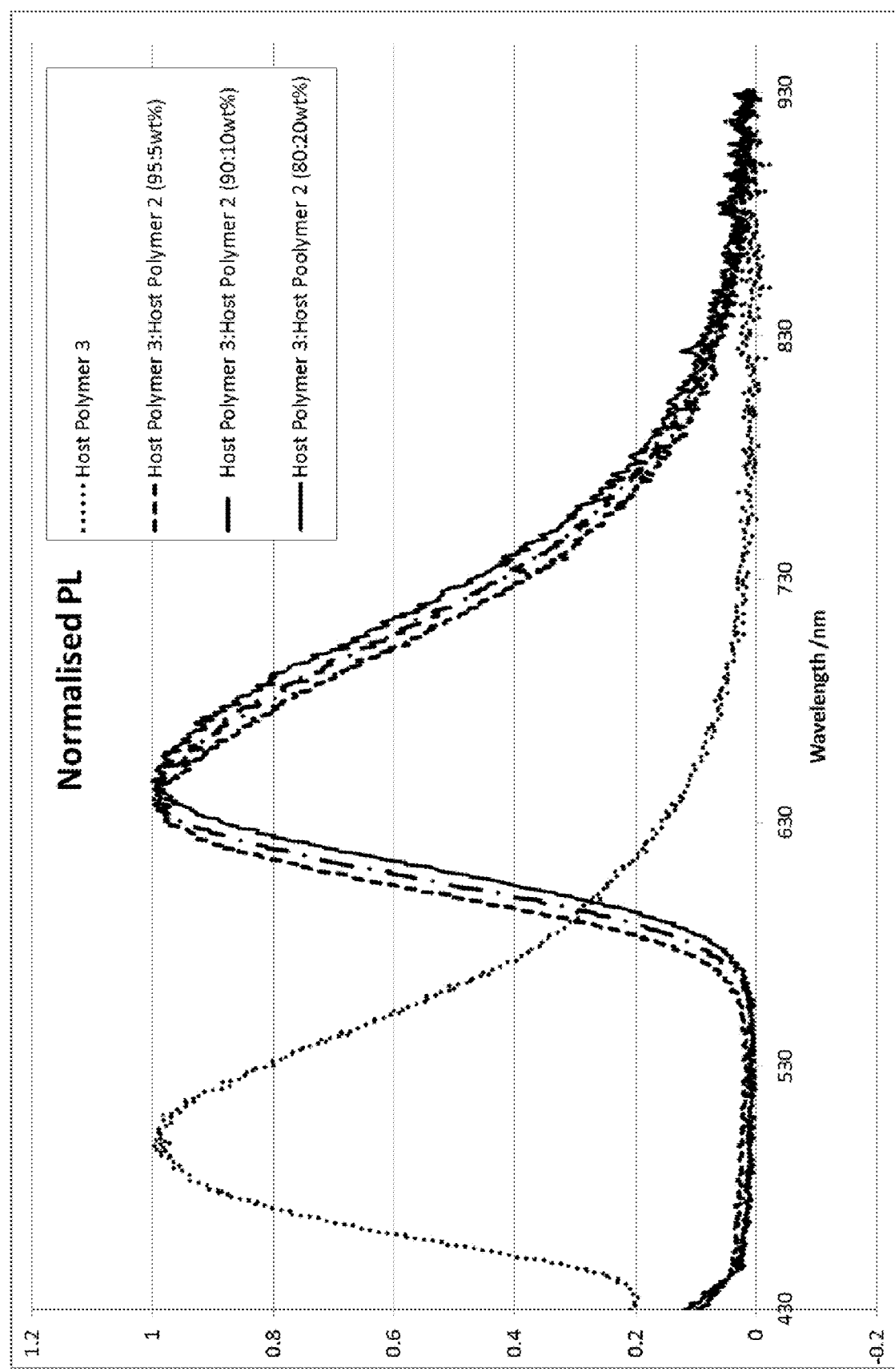

FLUORESCENT INFRARED EMITTING COMPOSITION

RELATED APPLICATIONS

This Application is a national stage filing under 35 U.S.C. § 371 of international PCT application no. PCT/GB2018/053719, filed Dec. 20, 2018, which claims priority to United Kingdom patent application no. GB 1721675.5, filed Dec. 21, 2017, each of which is incorporated herein by reference in its entirety.

FIELD OF THE INVENTION

The present invention relates to infrared emitting compositions, particularly compositions suitable for use in organic light-emitting devices.

BACKGROUND OF THE INVENTION

Electronic devices containing active organic materials include devices such as organic light emitting diodes (OLEDs), organic photoresponsive devices (in particular organic photovoltaic devices and organic photosensors), organic transistors and memory array devices. Devices containing active organic materials can offer benefits such as low weight, low power consumption and flexibility. Moreover, use of soluble organic materials allows use of solution processing in device manufacture, for example inkjet printing or spin-coating.

An OLED includes an anode, a cathode and one or more organic layers between the anode and cathode including at least one organic light-emitting layer.

Holes are injected into the device through the anode and electrons are injected through the cathode during operation of the device. Holes in the highest occupied molecular orbital (HOMO) and electrons in the lowest unoccupied molecular orbital (LUMO) of a light-emitting material combine to form an exciton that releases its energy as light.

A light emitting layer may comprise a semiconducting host material and a light-emitting dopant wherein energy is transferred from the host material to the light-emitting dopant. J. Appl. Phys. 65, 3610, 1989 discloses a host material doped with a fluorescent light-emitting dopant (that is, a light-emitting material in which light is emitted via decay of a singlet exciton).

Kang et al, Macromolecules, 1996, 29 (1), pp 165-169 discloses organic light-emitting diodes made from a blend of polymers.

OLEDs containing infrared emitting materials are also known as disclosed in, for example, Chuk-Lam Ho, Hua Li and Wai-Yeung Wong, "Red to near-infrared organometallic phosphorescent dyes for OLED applications", J. Organomet. Chem. 751 (2014), 261-285.

Infrared emitting materials have a relatively small bandgap compared to materials emitting in the visible region. Consequently, efficiency of infrared materials can be low due to a high proportion of excitons decaying non-radiatively in accordance with the energy gap law.

It is an object of the invention to provide high efficiency infrared emission.

SUMMARY OF THE INVENTION

The present inventors have surprisingly found that blending a fluorescent infrared-emitting material with a material having a higher photoluminescent quantum yield (PLQY) and shorter peak wavelength than the infrared emitting material results in an increase in efficiency of the infrared emitter.

Accordingly, in a first aspect the invention provides a fluorescent infrared emitting composition comprising a mixture of a first material and a second material wherein the first material is a fluorescent infrared material and the second material is a fluorescent material having a higher photoluminescent quantum yield (PLQY) and shorter peak wavelength than the infrared emitting material.

In a second aspect, the invention provides a solution comprising a composition according to the first aspect dissolved in one or more solvents.

In a third aspect, the invention provides an organic light-emitting device comprising an anode, a cathode and a light-emitting layer between the anode and cathode wherein the light-emitting layer comprises a composition according to the first aspect.

In a fourth aspect, the invention provides a method of forming an organic light-emitting device according to the third aspect, the method comprising the step of depositing the light-emitting layer over one of the anode and cathode, and depositing the other of the anode and cathode over the light-emitting layer.

DESCRIPTION OF THE DRAWINGS

The invention will now be described in more detail with reference to the Figures, in which:

FIG. 6 shows plots of photoluminescence spectra of comparative compositions of a host polymer and an emissive polymer in which the host polymer has a lower PLQY than the emissive polymer.

DETAILED DESCRIPTION OF THE INVENTION

Figure 1:
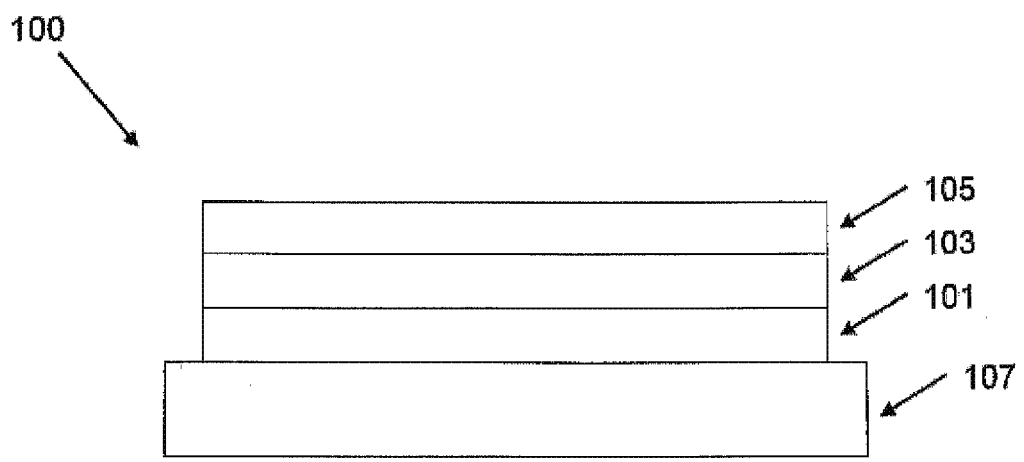
FIG. 1 illustrates an OLED according to an embodiment.

The composition as described herein comprises or consists of a fluorescent infrared material and a second material having a higher photoluminescent quantum yield (PLQY) and shorter peak wavelength than the infrared emitting material.

Optionally, the composition has a peak wavelength of at least 690 nm, preferably at least 700 nm. Optionally, the composition has a peak wavelength of up to about 900 nm, optionally 850 nm or 800 nm.

Optionally, the infrared emitting material has a peak wavelength in the range of about more than 700 nm up to about 950 nm, optionally from about 710 nm, 720 nm or 750 nm up to about 830 nm or 850 nm.

Optionally, the second material has a peak wavelength in the range of 400-680 nm, preferably 500-650 nm.

Optionally, the difference between peak wavelengths of the first and second materials is no more than about 250 nm, preferably no more than about 200 nm or about 150 nm.

Optionally, the difference in PLQY of the first and second materials is at least 20%, optionally at least 30%, 40% or 50%.

Optionally, second material:first material weight ratio is in the range of about 99:1-60:40, preferably 95:5-70:30.

Fluorescent Infrared Material

The fluorescent infrared material (the first material) may be polymeric or non-polymeric.

Preferably, the first material is polymeric. In this case, the polymer may be a conjugated or non-conjugated polymer. Preferably, the polymer is a conjugated polymer.

A first conjugated polymer material may comprise a repeat unit of formula I-A, I-B, I-C I-D, I-E, I-F, I-G or I-H:

Repeat units of formula I preferably make up 10-90 mol % of the repeat units of a copolymer.

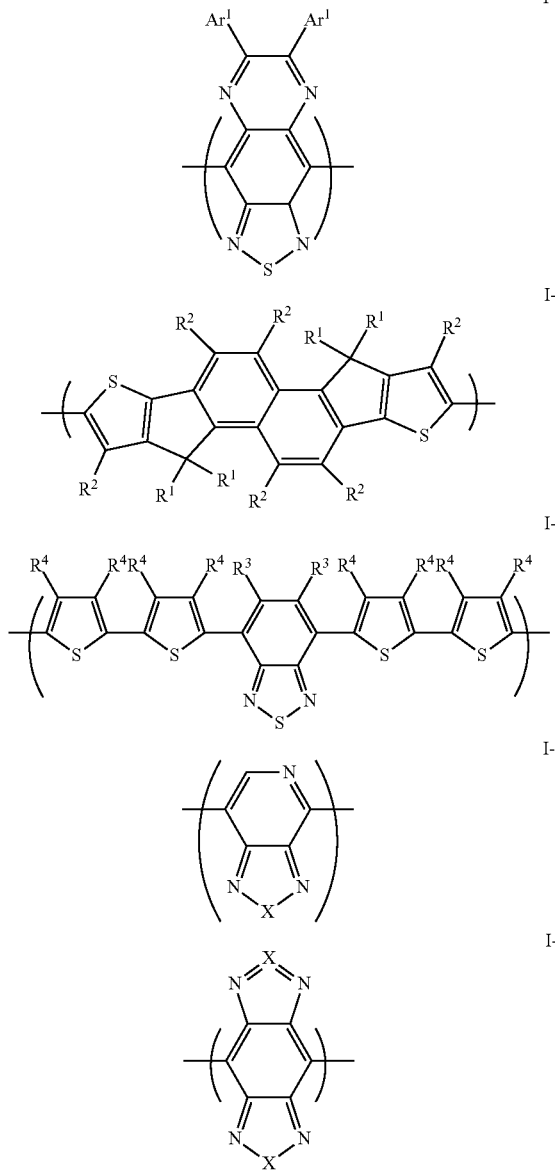

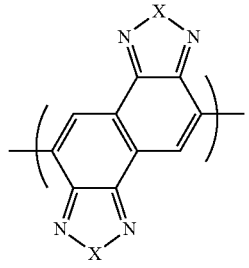

X = S, Se, O, NR$^1$

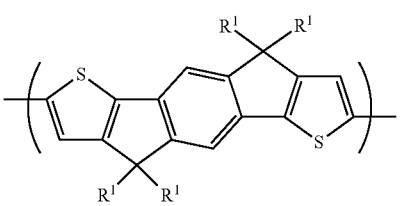

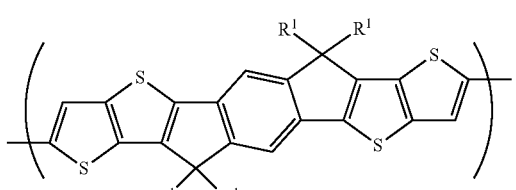

wherein Ar$^1$ is a C$_{6-20}$ aryl group or a 5-20 membered heteroaryl group which is unsubstituted or substituted with one or more substituents; R$^1$ in each occurrence is a substituent and the two groups R$^1$ may be linked to form a ring; and R$^2$, R$^3$ and R$^4$ independently in each occurrence is H or a substituent.

Ar$^1$ is preferably phenyl which is unsubstituted or substituted with one or more substituents, optionally one or more C$_{1-12}$ alkyl groups wherein one or more non-adjacent, non-terminal C atoms of the alkyl group may be replaced with O, S, C═O, or COO and one or more H atoms of the alkyl group may be replaced with F.

A "non-terminal carbon atom" of an alkyl group as used anywhere herein means carbon atoms other than the methyl group of a n-alkyl chain or the methyl groups of a branched alkyl chain.

Optionally, each R$^1$ is independently selected from the group consisting of:

alkyl, optionally C$_{1-20}$ alkyl, wherein one or more non-adjacent C atoms may be replaced with optionally substituted aryl or heteroaryl, O, S, substituted N, C═O or —COO—, and one or more H atoms may be replaced with F; and aryl and heteroaryl groups, preferably C$_{6-20}$ aryl groups, more preferably phenyl, which may be unsubstituted or substituted with one or more substituents.

Each R$^1$ is preferably a C$_{1-20}$ alkyl group.

Optionally, R$^2$, R$^3$ and R$^4$ are each independently selected from the group consisting of H; F; CN; NO2; alkyl, optionally C$_{1-20}$ alkyl, wherein one or more non-adjacent C atoms may be replaced with optionally substituted aryl or heteroaryl, O, S, substituted N, C═O or —COO—, and one or more H atoms may be replaced with F; and aryl and heteroaryl groups, preferably C$_{6-20}$ aryl groups, more preferably phenyl, which may be unsubstituted or substituted with one or more substituents.

In the case where $R^1$, $R^2$, $R^3$ or $R^4$ is aryl or heteroaryl, substituents (if present) of the aryl or heteroaryl may be selected from $C_{1-12}$ alkyl groups wherein one or more non-adjacent, non-terminal C atoms of the alkyl group may be replaced with O, S, C=O, or COO and one or more H atoms of the alkyl group may be replaced with F.

Each $R^2$ is preferably H.

Each $R^3$ is preferably H.

Each $R^4$ is preferably selected from H and $C_{1-20}$ alkyl. Optionally, at least two $R^4$ groups bound to different thiophene rings are $C_{1-20}$ alkyl.

Second Material

The second material may be polymeric or non-polymeric. Preferably, the second material is polymeric. A second polymeric material may be conjugated or non-conjugated, preferably conjugated.

Optionally, a second conjugated polymer comprises a repeat unit of formula II-A, II-B, II-C or II-D:

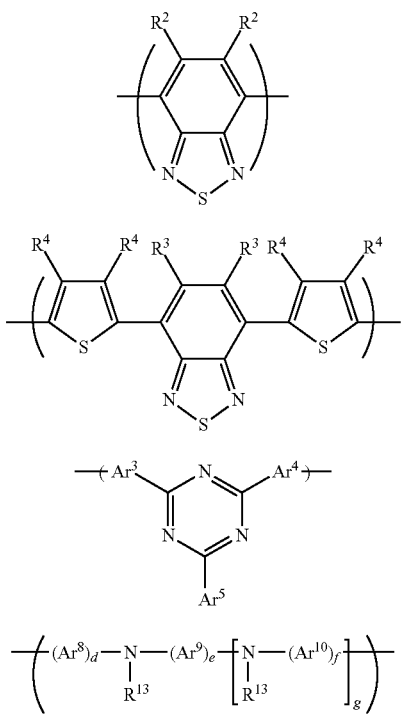

With reference to formulae II-A and II-B, $R^2$, $R^3$ and $R^4$ are as described above.

With reference to formula II-C, $Ar^3$ and $Ar^4$ are each a $C_{6-20}$ arylene group, preferably phenylene, and $Ar^5$ is a $C_{6-20}$ aryl group, preferably phenyl. $Ar^3$, $Ar^4$ and $Ar^5$ are each independently unsubstituted or substituted with one or more substituents, Optionally, substituents of $Ar^3$ and $Ar^4$ are selected from CN; $NO_2$; and $C_{1-20}$ alkyl wherein one or more non-adjacent, non-terminal C atoms of the alkyl group may be replaced with O, S, $NR^3$ or $SiR^3_2$, COO or CO; wherein $R^3$ in each occurrence is a $C_{1-20}$ hydrocarbyl group, optionally a $C_{1-12}$ alkyl group, unsubstituted phenyl, or phenyl substituted with one or more alkyl groups.

Optionally, substituents of $Ar^5$ are selected from CN; $NO_2$; $C_{1-20}$ alkyl wherein one or more non-adjacent, non-terminal C atoms of the alkyl group may be replaced with O, S, $NR^3$ or $SiR^3_2$, COO or CO; phenyl which is unsubstituted or substituted with one or more substituents; and pyridyl which is unsubstituted or substituted with one or more substituents. Substituents of phenyl or pyridyl, if present, may be selected from $C_{1-12}$ alkyl.

With reference to formula II-D, $Ar^8$, $Ar^9$ and $Ar^{10}$ in each occurrence are independently selected from substituted or unsubstituted aryl or heteroaryl, g is 0, 1 or 2, preferably 0 or 1, $R^{13}$ independently in each occurrence is a substituent, and d, e and f are each independently 1, 2 or 3.

$R^{13}$, which may be the same or different in each occurrence when g is 1 or 2, is preferably selected from the group consisting of alkyl, optionally $C_{1-20}$ alkyl, $Ar^{11}$ and a branched or linear chain of $Ar^{11}$ groups wherein $Ar^{11}$ in each occurrence is independently substituted or unsubstituted aryl or heteroaryl.

Any two aromatic or heteroaromatic groups selected from $Ar^8$, $Ar^9$, and, if present, $Ar^{10}$ and $Ar^{11}$ that are directly bound to the same N atom may be linked by a direct bond or a divalent linking atom or group. Preferred divalent linking atoms and groups include 0, S; substituted N; and substituted C.

$Ar^8$ and $Ar^{10}$ are preferably $C_{6-20}$ aryl, more preferably phenyl, which may be unsubstituted or substituted with one or more substituents.

In the case where g=0, $Ar^9$ is preferably $C_{6-20}$ aryl, more preferably phenyl, that may be unsubstituted or substituted with one or more substituents.

In the case where g=1, $Ar^9$ is preferably $C_{6-20}$ aryl, more preferably phenyl or a polycyclic aromatic group, for example naphthalene, perylene, anthracene or fluorene, that may be unsubstituted or substituted with one or more substituents.

$R^{13}$ is preferably $Ar^{11}$ or a branched or linear chain of $Ar^{11}$ groups. $Ar^{11}$ in each occurrence is preferably phenyl that may be unsubstituted or substituted with one or more substituents.

Exemplary groups $R^{13}$ include the following, each of which may be unsubstituted or substituted with one or more substituents, and wherein * represents a point of attachment to N:

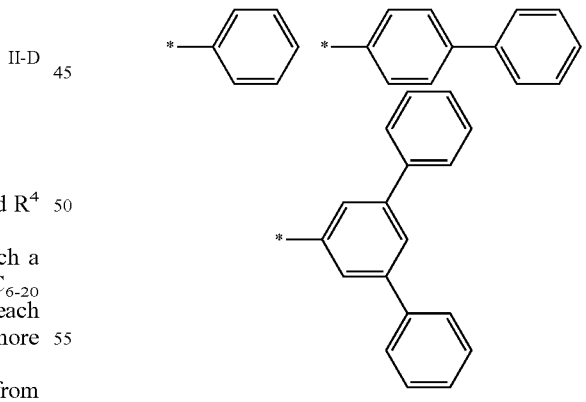

d e and f are preferably each 1.

$Ar^8$, $Ar^9$, and, if present, $Ar^{10}$ and $Ar^{11}$ are each independently unsubstituted or substituted with one or more, optionally 1, 2, 3 or 4, substituents. Exemplary substituents may be selected from substituted or unsubstituted alkyl, optionally $C_{1-20}$ alkyl, wherein one or more non-adjacent C atoms may be replaced with optionally substituted aryl or heteroaryl (preferably phenyl), O, S, C=O or —COO— and one or more H atoms may be replaced with F.

Preferred substituents of $Ar^8$, $Ar^9$, and, if present, $Ar^{10}$ and $Ar^{11}$ are $C_{1-40}$ hydrocarbyl, preferably $C_{1-20}$ alkyl.

Preferred repeat units of formula (VI) include unsubstituted or substituted units of formulae (VI-1), (VI-2) and (VI-3):

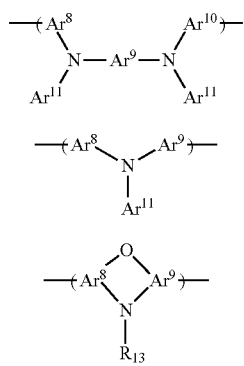

First and second polymers as described herein may each comprise one or more arylene repeat units.

Arylene repeat units may form 10-90 mol % of the repeat units of the first polymer or the second polymer.

Arylene repeat units may be selected from formulae (VII)-(X):

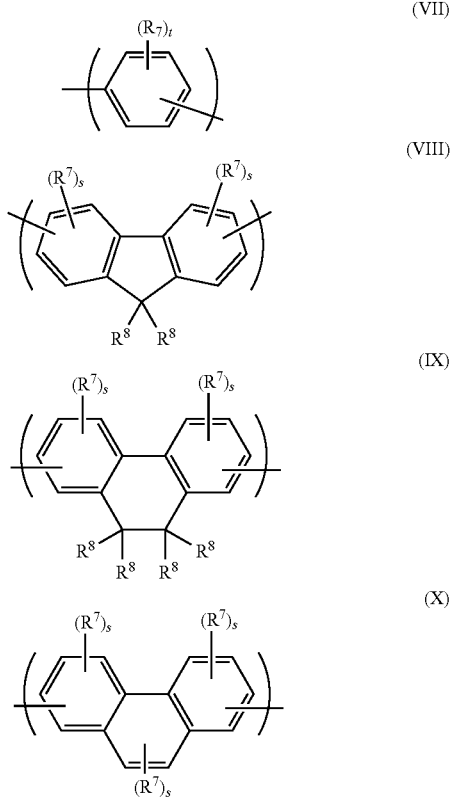

wherein t in each occurrence is independently 0, 1, 2, 3 or 4, preferably 1 or 2; $R^7$ independently in each occurrence is a substituent; s in each occurrence is independently 0, 1 or 2, preferably 0 or 1; and $R^8$ independently in each occurrence is a substituent wherein two $R^8$ groups may be linked to form an unsubstituted or substituted ring.

Where present, each $R^7$ and $R^8$ may independently be selected from the group consisting of:
  alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F;
  aryl and heteroaryl groups, preferably $C_{6-20}$ aryl groups, more preferably phenyl, that may be unsubstituted or substituted with one or more substituents; and
  a linear or branched chain of aryl or heteroaryl groups, preferably $C_{6-20}$ aryl groups, more preferably phenyl, each of which groups may independently be substituted, optionally a group of formula —$(Ar^{12})_v$ wherein each $Ar^{12}$ is independently an aryl or heteroaryl group and v is at least 2, preferably a branched or linear chain of phenyl groups.

In the case where $R^7$ or $R^8$ comprises an aryl or heteroaryl group, or a linear or branched chain of aryl or heteroaryl groups, the or each aryl or heteroaryl group may be substituted with one or more substituents $R^6$ selected from the group consisting of:
  alkyl, for example $C_{1-20}$ alkyl, wherein one or more non-adjacent C atoms may be replaced with O, S, substituted N, C=O and —COO— and one or more H atoms of the alkyl group may be replaced with F;
  $NR^9_2$, $OR^9$, $SR^9$, $SiR^9_3$ and fluorine, nitro and cyano;
wherein each $R^9$ is independently selected from the group consisting of alkyl, preferably $C_{1-20}$ alkyl; and aryl or heteroaryl, preferably phenyl, optionally substituted with one or more $C_{1-20}$ alkyl groups.

Substituted N, where present, may be —$NR^{10}$— wherein $R^{10}$ is a substituent and is optionally a $C_{1-40}$ hydrocarbyl group, optionally a $C_{1-20}$ alkyl group.

Preferred substituents of aryl or heteroaryl groups of $R^7$ or $R^8$ are selected from $C_{1-20}$ alkyl.

In the case where two groups $R^8$ form a ring, the one or more substituents of the ring, if present, are optionally selected from $C_{1-20}$ alkyl groups.

Preferably, each $R^7$, where present, and $R^8$ is independently selected from $C_{1-40}$ hydrocarbyl. Preferred $C_{1-40}$ hydrocarbyl groups are $C_{1-20}$ alkyl; unsubstituted phenyl; phenyl substituted with one or more $C_{1-20}$ alkyl groups; and a linear or branched chain of phenyl groups, wherein each phenyl may be unsubstituted or substituted with one or more $C_{1-20}$ alkyl groups.

Polymers as described herein may have a polystyrene-equivalent number-average molecular weight (Mn) measured by gel permeation chromatography in the range of about $3 \times 10^3$ to $1 \times 10^8$, and preferably $1 \times 10^3$ to $5 \times 10^6$. The polystyrene-equivalent weight-average molecular weight (Mw) of the polymers described herein may be $1 \times 10^3$ to $1 \times 10^8$, and preferably $1 \times 10^4$ to $1 \times 10^7$.

Polymers as described herein are preferably amorphous.

Organic Light-Emitting Device

A composition as described herein may be provided in a light-emitting layer of an organic light-emitting device.

FIG. 1, which is not drawn to any scale, illustrates schematically an OLED 100 according to an embodiment. The OLED 100 is carried on substrate 107 and comprises an anode 101, a cathode 105 and a light-emitting layer 103 between the anode and the cathode. In other embodiments, the positions of the anode and cathode may be reversed, i.e. the cathode is the electrode on, or otherwise closest to, the substrate.

The light-emitting layer comprises an infrared emitting composition as described herein.

Preferably, light-emitting layer 103 is the only layer of the device which emits light when in use.

Further layers (not shown) may be provided between the anode and the cathode including, without limitation, hole-transporting layers, electron-transporting layers, hole-blocking layers, electron-blocking layers, hole-injection layers and electron-injection layers.

Exemplary OLED structures including one or more further layers include the following:
Anode/Hole-injection layer/Light-emitting layer/Cathode
Anode/Hole transporting layer/Light-emitting layer/Cathode
Anode/Hole-injection layer/Hole-transporting layer/Light-emitting layer/Cathode
Anode/Hole-injection layer/Hole-transporting layer/Light-emitting layer/Electron-transporting layer/Cathode
Anode/Hole-injection layer/Hole-transporting layer/Light-emitting layer/Electron-injecting layer/Cathode Preferably, the device comprises one or both, more preferably both, of a hole-injection layer and a hole-transporting layer.

Preferably, the device comprises at least one of an electron-transporting layer and an electron injection layer.

Charge Transporting and Charge Blocking Layers

A hole transporting layer may be provided between the anode of an OLED and the light-emitting layer.

An electron transporting layer may be provided between the cathode of an OLED and the light-emitting layer.

An electron blocking layer may be provided between the anode and the light-emitting layer.

A hole blocking layer may be provided between the cathode and the light-emitting layer.

Transporting and blocking layers may be used in combination. Depending on its HOMO and LUMO levels, a single layer may both transport one of holes and electrons and block the other of holes and electrons.

A charge-transporting layer or charge-blocking layer may be crosslinked, particularly if a layer overlying that charge-transporting or charge-blocking layer is deposited from a solution. The crosslinkable group used for this crosslinking may be a crosslinkable group comprising a reactive double bond such and a vinyl or acrylate group, or a benzocyclobutane group. The crosslinkable group may be provided as a substituent pendant from the backbone of a charge-transporting or charge-blocking polymer. Following formation of a charge-transporting or charge blocking layer, the crosslinkable group may be crosslinked by thermal treatment or irradiation.

If present, a hole transporting layer located between the anode and the light-emitting layer preferably contains a hole-transporting material having a HOMO level of less than or equal to 5.5 eV, more preferably around 4.8-5.5 eV as measured by square wave voltammetry. The HOMO level of the hole transporting material of the hole-transporting layer may be selected so as to be within 0.2 eV, optionally within 0.1 eV, of the HOMO of a component of the light-emitting layer in order to provide a small barrier to hole transport.

A hole-transporting material of a hole-transporting polymer may be a polymer comprising a repeat unit of formula II-D as described herein, optionally a homopolymer of a repeat unit of formula II-D or a copolymer comprising a repeat unit of formula II-D and one or more co-repeat units, optionally one or more arylene co-repeat units as described herein. One or more repeat units of such a hole-transporting polymer may be substituted with a crosslinkable group, optionally a crosslinkable double bond group and/or a crosslinkable benzocyclobutane group, that may be crosslinked following deposition of the hole-transporting polymer to form the hole-transporting layer.

If present, an electron transporting layer located between the light-emitting layers and cathode preferably has a LUMO level of around 2.5-3.5 eV as measured by square wave voltammetry. A layer of a silicon monoxide or silicon dioxide or other thin dielectric layer having thickness in the range of 0.2-2 nm may be provided between the light-emitting layer nearest the cathode and the cathode.

An electron transporting layer may contain a polymer comprising a chain of optionally substituted arylene repeat units, such as a chain of fluorene repeat units.

Hole Injection Layers

A conductive hole injection layer, which may be formed from a conductive organic or inorganic material, may be provided between the anode and the light-emitting layer or layers to assist hole injection from the anode into the layer or layers of semiconducting polymer. A hole transporting layer may be used in combination with a hole injection layer.

Examples of doped organic hole injection materials include optionally substituted, doped poly(ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. Nos. 5,723,873 and 5,798,170; and optionally substituted polythiophene or poly(thienothiophene). Examples of conductive inorganic materials include transition metal oxides such as $VO_x$, $MoO_x$ and $RuO_x$ as disclosed in Journal of Physics D: Applied Physics (1996), 29(11), 2750-2753.

Cathode

The cathode is selected from materials that have a work function allowing injection of electrons into the light-emitting layer or layers.

The cathode may consist of a single material such as a layer of aluminium. The cathode may comprise a plurality of metals, for example a bilayer such as calcium and aluminium as disclosed in WO 98/10621. The cathode may contain or consist of a layer of silver, for example a bilayer of silver and aluminium. Inclusion of a layer of silver is particularly advantageous due to its high reflectivity of infrared wavelengths. The cathode may contain a layer containing elemental barium, for example as disclosed in WO 98/57381, Appl. Phys. Lett. 2002, 81(4), 634 and WO 02/84759 or a layer containing elemental magnesium. The cathode may contain a thin (e.g. 1-5 nm thick) layer of metal compound between the light-emitting layer(s) of the OLED and one or more conductive layers of the cathode, such as one or more metal layers. Exemplary metal compounds include an oxide or fluoride of an alkali or alkali earth metal to assist electron injection, for example lithium fluoride as disclosed in WO 00/48258; barium fluoride as disclosed in Appl. Phys. Lett. 2001, 79(5), 2001; and barium oxide. In order to provide efficient injection of electrons into the device, the cathode preferably has a work function of less than 3.5 eV, more preferably less than 3.2 eV, most preferably less than 3 eV. Work functions of metals can be found in, for example, Michaelson, J. Appl. Phys. 48(11), 4729, 1977.

Layer Formation

A layer comprising an infrared composition as described herein may be deposited by any suitable method including, without limitation, vacuum evaporation and deposition from a solution. Preferably the composition is deposited from a formulation comprising the composition dissolved in one or more organic solvents.

Suitable solvents include, without limitation, benzenes with one or more alkyl substituents such as toluene and xylene and mono- or poly-alkoxybenzenes, and mixtures thereof.

Exemplary solution deposition techniques include printing and coating techniques such spin-coating, dip-coating, roll-to-roll coating or roll-to-roll printing, doctor blade coating, slot die coating, gravure printing, screen printing and inkjet printing.

Solution deposition methods may be used to form other layers of an OLED including (where present) a hole injection layer, a charge transporting layer and a charge blocking layer.

Applications

An infrared emitting organic light-emitting diode as described herein may be used, without limitation, in night vision goggles, sensors and CMOS chips. A sensor may comprise one or more OLEDs as described herein and at least one photodetector device, the or each photodetector device being configured to detect emission from the one more OLEDs. Optionally, the OLED of a sensor, preferably the OLED of a wearable sensor, has an operating voltage of no more than 5V.

EXAMPLES

Measurements

Photoluminescence peak values and PLQY values as described herein were measured in an integrating sphere connected to Hamamatsu C9920-02 with a xenon lamp L8474 and a monochromator for choice of exact wavelength. Samples were with prepared by spin-coating a film of the fluorescent material onto a quartz disk.

COMPOSITION EXAMPLES

Infrared Polymer 1 was mixed with Host Polymer 1 or Host Polymer 2 in amounts set out in Table 1.

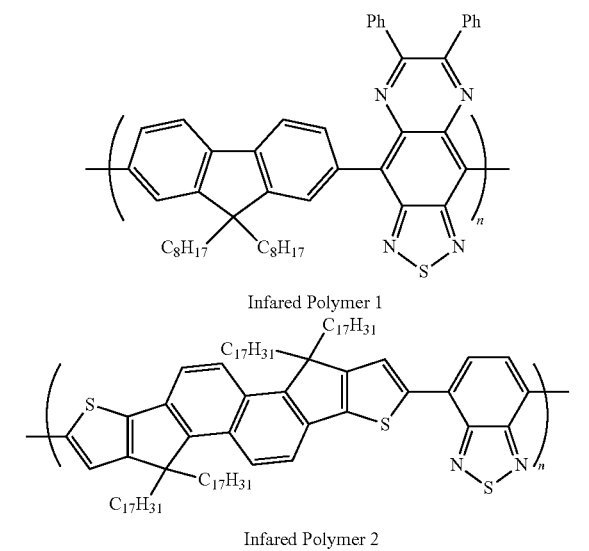

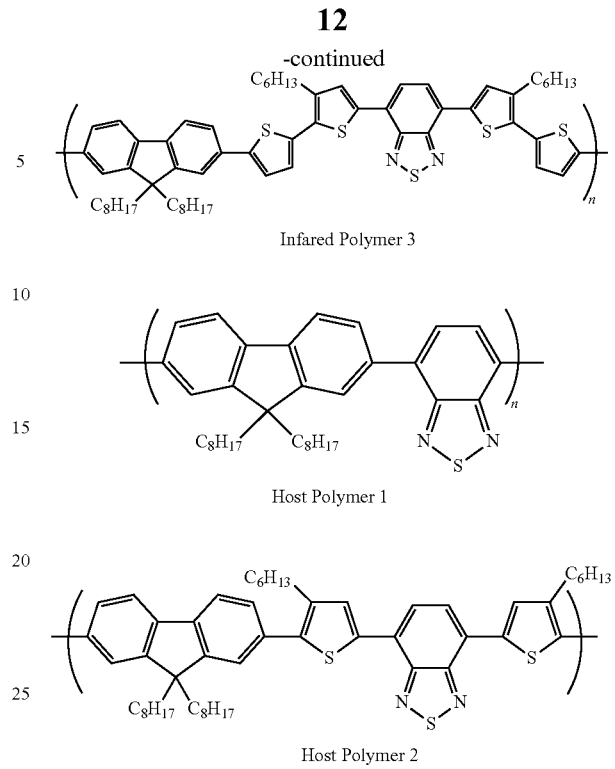

Host Polymers 3, 4 and 5 were prepared was prepared by Suzuki polymerisation as disclosed in WO 00/53656 of the following monomers:

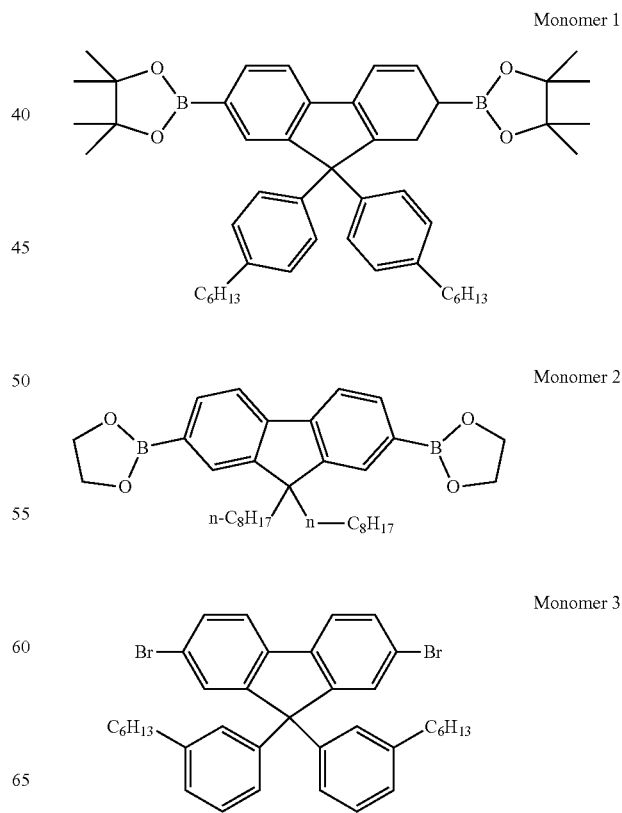

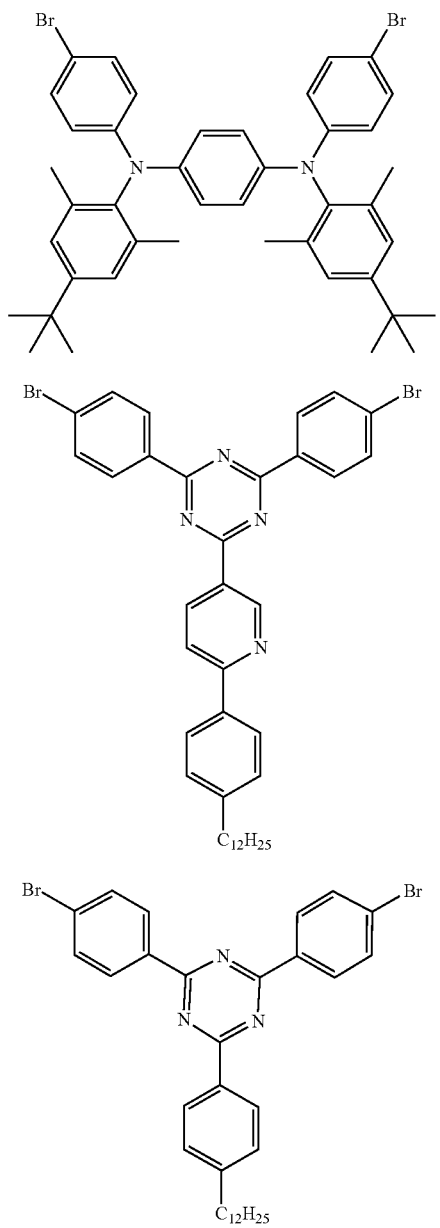

| Polymer | Monomers (mol %) |
|---|---|
| Host Polymer 3 | 1 (36), 2 (14), 3 (12.5), 4 (7.5), 5 (30) |
| Host Polymer 4 | 1 (36), 2 (14), 3 (32.5), 4 (7.5), 6 (10) |
| Host Polymer 5 | 1 (36), 2 (14), 3 (12.5), 4 (7.5), 6 (30) |

TABLE 1

Compositions containing Infrared Polymer 1

| Polymers | Ratio (wt %) | PLQY (%) | Emission peak wavelength (nm) |
|---|---|---|---|
| Infrared Polymer 1 | — | 14.5 | 750-766 |
| Host Polymer 1 | — | 76.5 | 561 |
| Host Polymer 2 | — | 51.6 | 637-646 |
| Host Polymer 1:Infrared Polymer 1 | 90:10 | 49.2 | 700-710 |
| Host Polymer 1:Infrared Polymer 1 | 80:20 | 38.7 | 703-710 |
| Host Polymer 2:Infrared Polymer 1 | 90:10 | 27.4 | 725 |
| Host Polymer 2:Infrared Polymer 1 | 80:20 | 23.0 | 725-733 |

Figure 2:
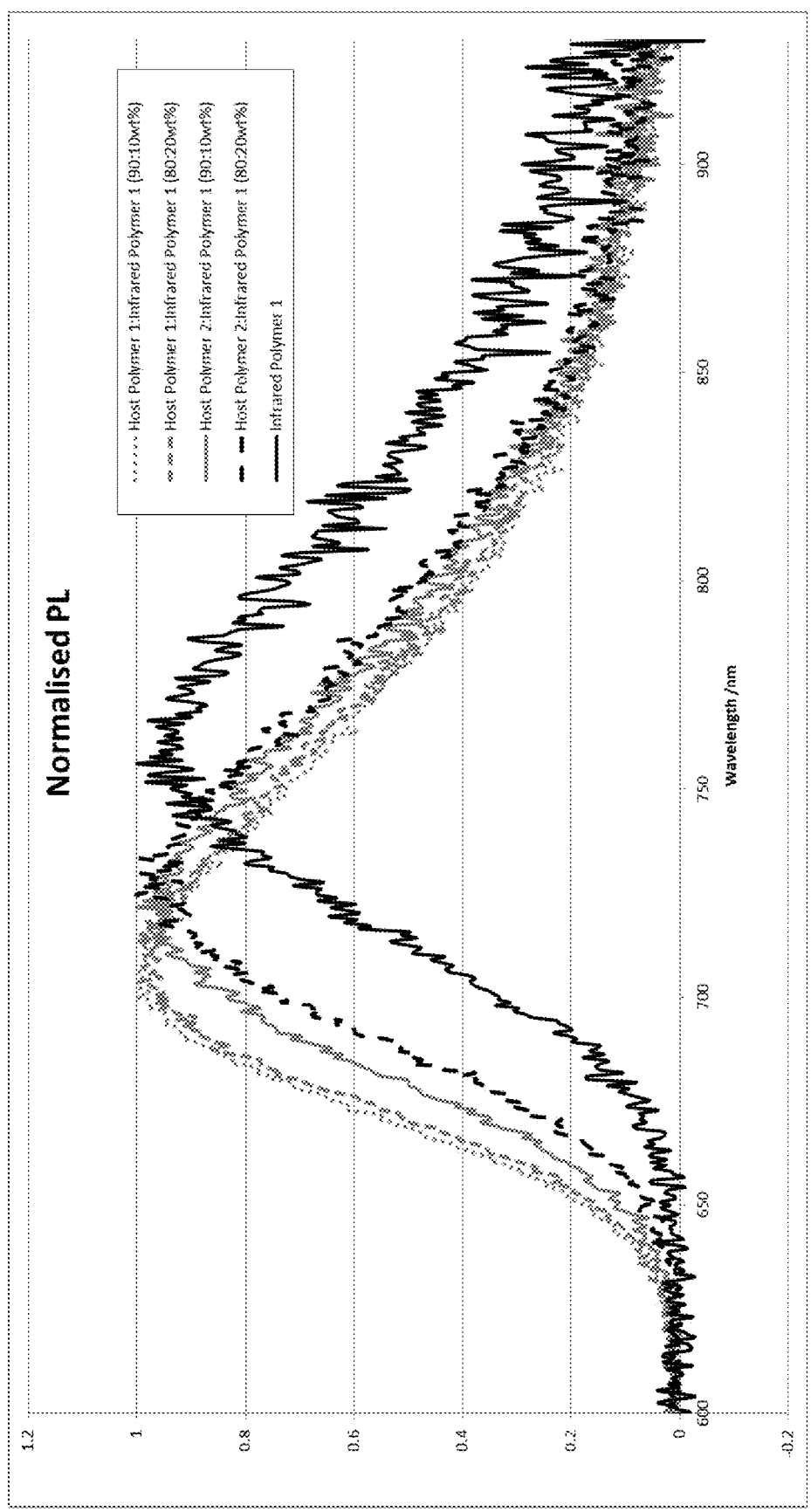
FIG. 2 shows plots of photoluminescence spectra of compositions according to embodiments of Infrared Polymer 1 with two different host polymers.

Normalised photoluminescent spectra for compositions containing Infrared Polymer 1 are shown in FIG. 2.

TABLE 2

Compositions containing Infrared Polymer 2

| Polymers | Ratio (wt %) | PLQY (%) | Emission peak wavelength (nm) |
|---|---|---|---|
| Infrared Polymer 2 | — | 23.0 | 789-801 |
| Host Polymer 1 | — | 76.5 | 561 |
| Host Polymer 1:Infrared Polymer 2 | 90:10 | 46.3 | 725-731 |
| Host Polymer 1:Infrared Polymer 2 | 80:20 | 40.0 | 728-737 |

Figure 3:
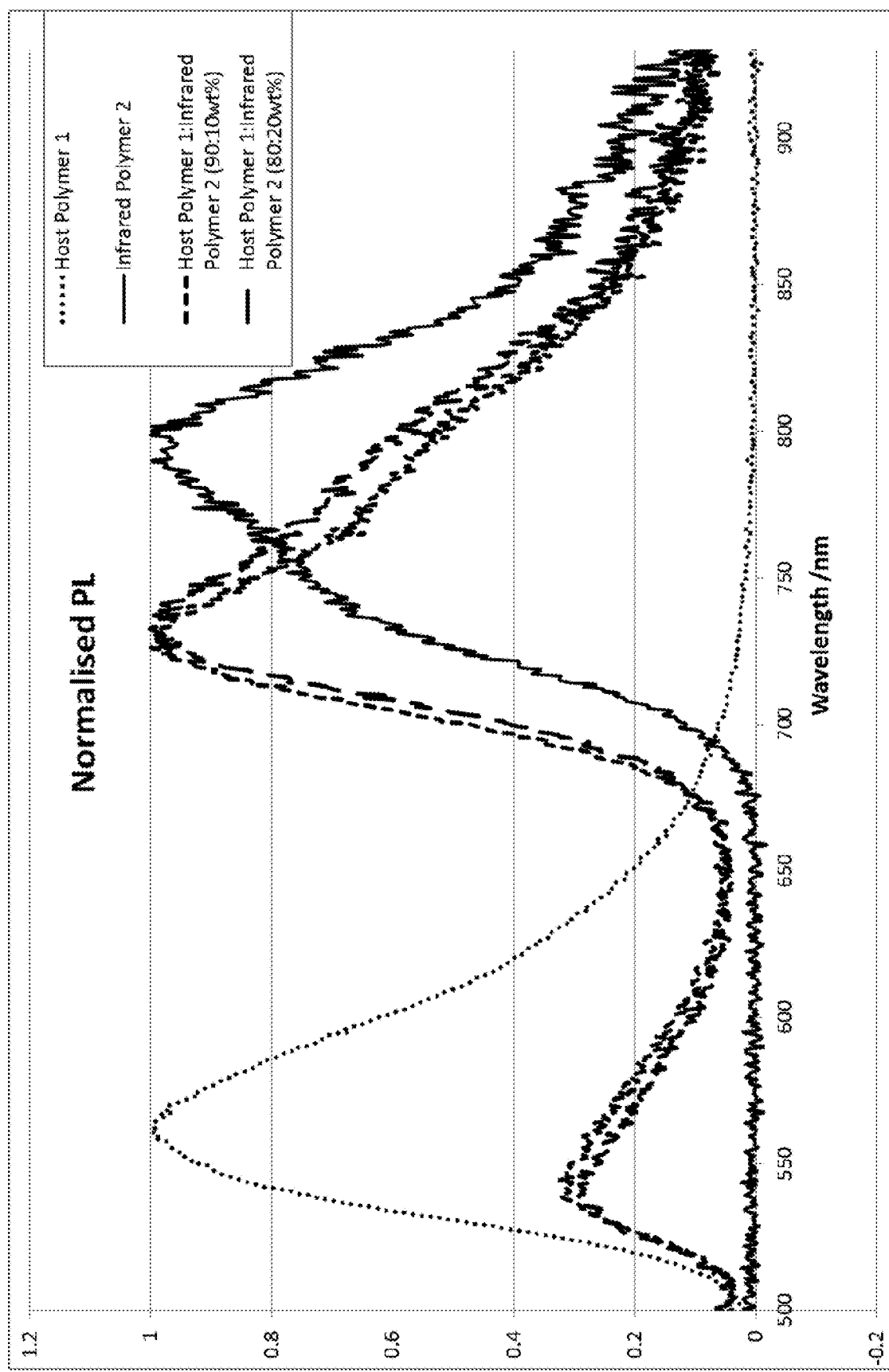
FIG. 3 shows plots of photoluminescence spectra of compositions according to embodiments of Infrared Polymer 2 and a host polymer compared to the spectra of Infrared Polymer 2 and the host polymer alone.

Normalised photoluminescent spectra for compositions containing Infrared Polymer 2 are shown in FIG. 3.

TABLE 3

Compositions containing Infrared Polymer 3

| Polymers | Ratio (wt %) | PLQY (%) | Emission peak wavelength (nm) |
|---|---|---|---|
| Infrared Polymer 3 | — | 19.0 | 736-744 |
| Host Polymer 1 | — | 76.5 | 561 |
| Host Polymer 1:Infrared Polymer 3 | 95:5 | 44.8 | ~696 |
| Host Polymer 1:Infrared Polymer 3 | 90:10 | 43.3 | ~700-704 |
| Host Polymer 1:Infrared Polymer 3 | 80:20 | 38.5 | ~707-712 |
| Host Polymer 4:Infrared Polymer 3 | 90:10 | 35.0 | 688-695 |
| Host Polymer 4:Infrared Polymer 3 | 80:20 | 33.4 | 699-705 |

Figure 4:
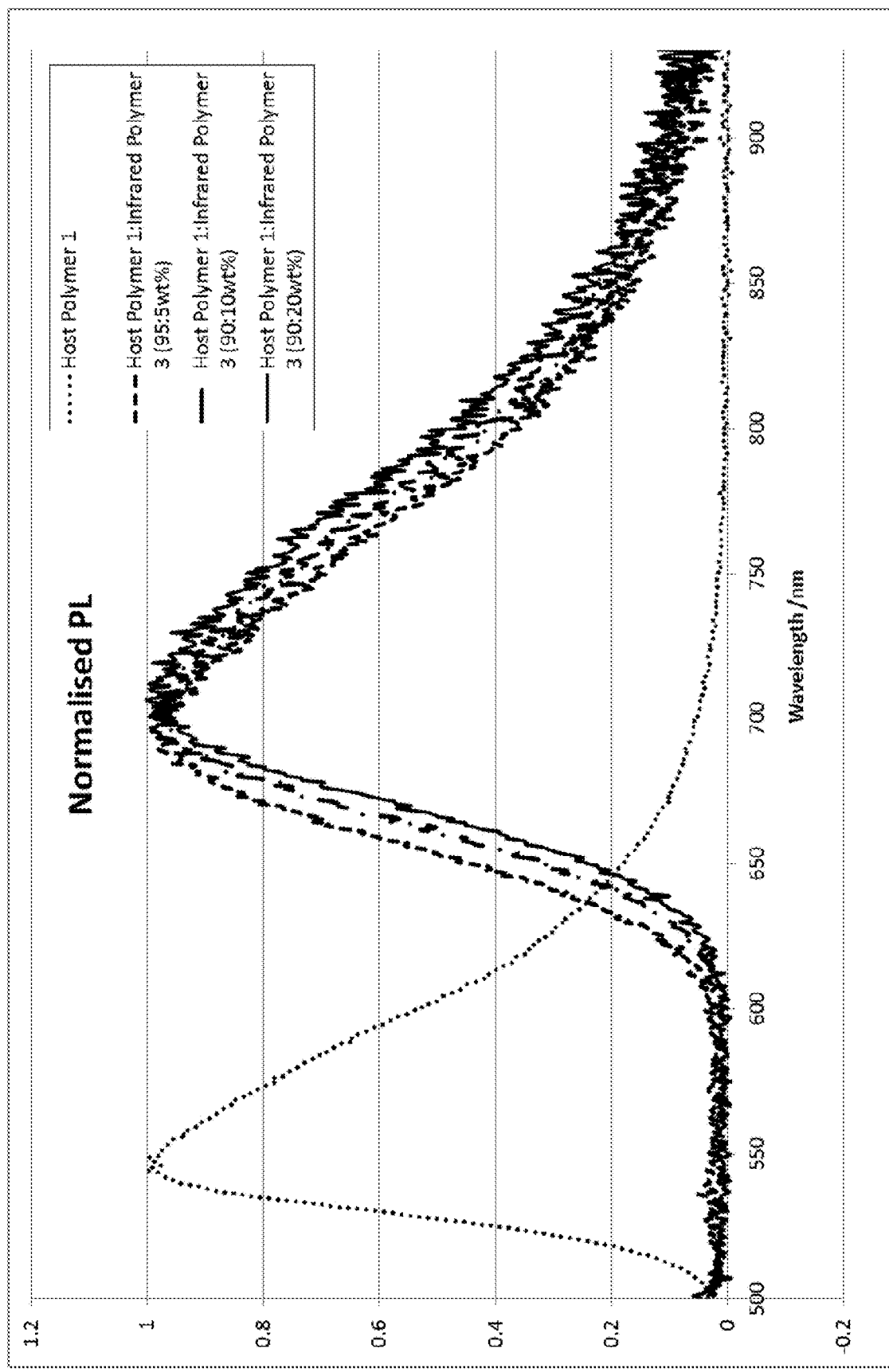
FIG. 4 shows plots of photoluminescence spectra of compositions according to embodiments of Infrared Polymer 3 and a host polymer compared to the spectrum of the host polymer alone.
Figure 5:
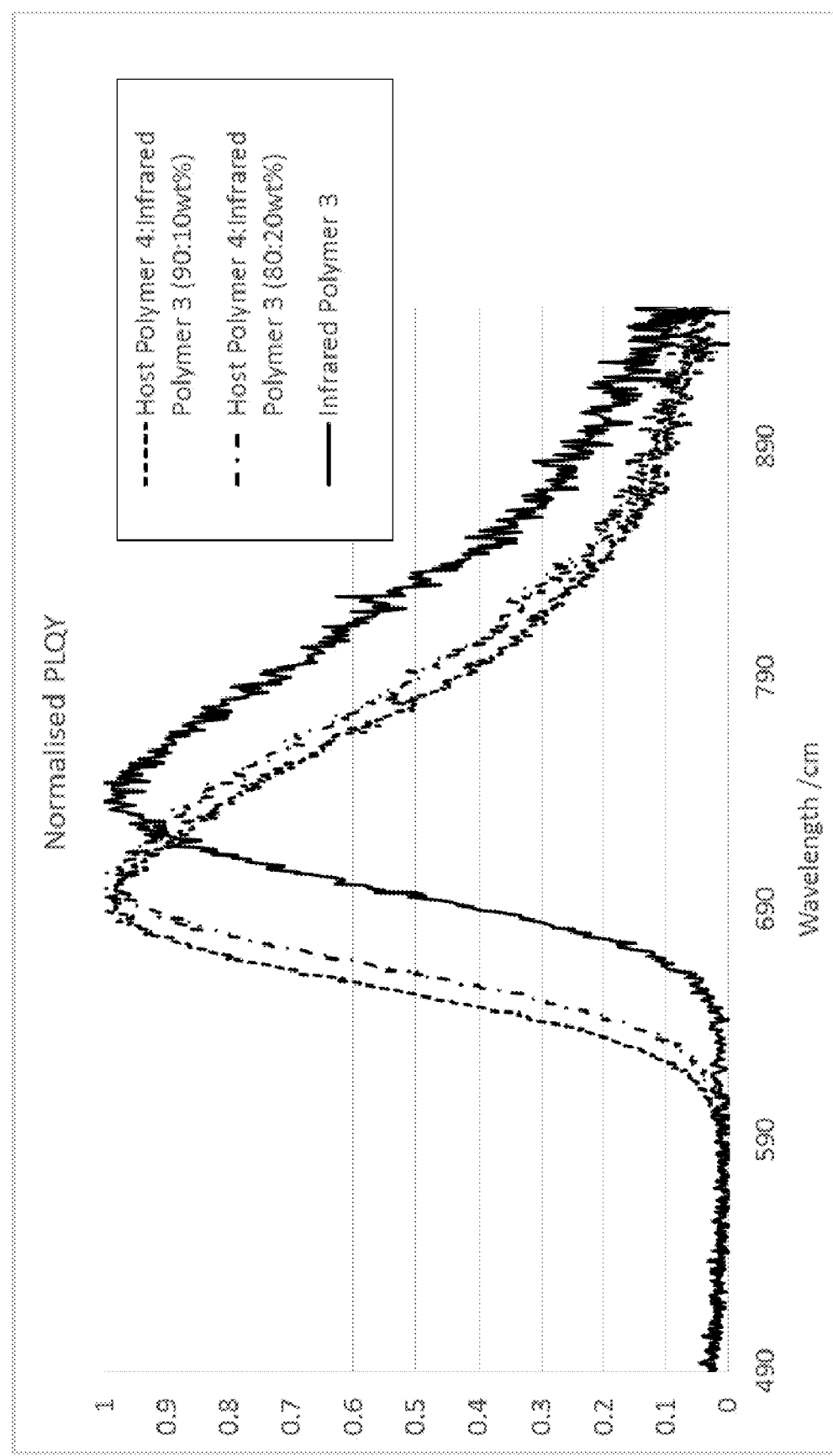
FIG. 5 shows plots of photoluminescence spectra of compositions according to embodiments of Infrared Polymer 3 and a host polymer compared to the spectrum of the infrared polymer alone.

Normalised photoluminescent spectra for compositions containing Infrared Polymer 3 are shown in FIGS. 4 and 5.

As shown in Tables 1-3, photoluminescent quantum yield (PLQY) of blends of the infrared polymers with a host polymer is increased and peak wavelength is slightly shifted to a shorter wavelength as compared to the infrared polymer alone.

Comparative Composition

Tables 1-3 show increased efficiency of infrared polymers when mixed with a higher PLQY, shorter peak wavelength host.

With reference to Table 4, little or no change in PLQY is observed when an emissive polymer is mixed with a low efficiency host polymer. In this case, the Host Polymer 3 was used as a host for Host Polymer 2, which has a longer peak wavelength than Host Polymer 3.

| Polymers | Ratio (wt %) | PLQY (%) | Emission peak wavelength (nm) |
|---|---|---|---|
| Host Polymer 2 | — | 51.6 | 637-646 |
| Host Polymer 3 | — | 20.3 | ~497 |
| Host Polymer 3:Host Polymer 2 | 95:5 | 48.1 | ~636-641 |
| Host Polymer 3:Host Polymer 2 | 90:10 | 48.2 | ~640-650 |
| Host Polymer 3:Host Polymer 2 | 80:20 | 45.0 | ~643-651 |

Normalised photoluminescent spectra for compositions containing Host Polymers 2 and 3 are shown in FIG. 6.

Device Example 1

Infrared emitting OLEDs having the following structure were formed on a glass substrate:

ITO/HIL (65 nm)/HTL (20 nm)/LEL (50 nm)/ETL (40 nm)/Cathode in which ITO is an indium tin oxide anode; HIL is a hole-injection layer; HTL is a hole-transporting layer; LEL is an infrared light-emitting layer; and ETL is an electron-transporting layer.

To form the device, the ITO was baked and treated with UV and ozone and the hole injection layer was then formed by spin-coating an aqueous formulation of a hole-injection material available from Nissan Chemical Industries onto the ITO and heating the resultant layer at 180° C. for 15 minutes in air. The hole transporting layer was formed by spin-coating a hole-transporting polymer comprising fluorene and amine repeat units as described in WO 2013/108022, the contents of which are incorporated herein by reference, from o-xylene solution and crosslinking the polymer by heating in a glovebox in a nitrogen atmosphere at 190° C. (as measured for the device layer in contact with the heated surface, e.g. glass substrate) for 60 minutes. The light-emitting layer was formed by spin-coating Host Polymer 4: Infrared Polymer 2 (90:10 wt) from o-xylene solution. An electron-transporting layer was formed by spin-coating an electron-transporting polymer substituted with a Cs salt as disclosed in WO 2012/133229 and n-dopant 1 from methanol solution in a glovebox in a nitrogen atmosphere followed by baking at 160° C. for 10 minutes. The cathode was formed by evaporation of a first layer of aluminium (100 nm) and a second layer of silver (100 nm). The completed devices were encapsulated.

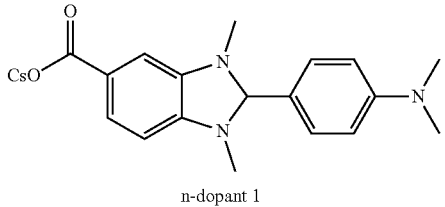

n-dopant 1

Comparative Device 1

For the purpose of comparison, a device was prepared as described in Device Example 1 except that the light-emitting layer was formed by spin-coating Infrared Polymer 2 only. With reference to Table 4, Device Example 1 has higher external quantum efficiency (EQE) and radiant power than Comparative Device 1.

TABLE 4

| Device | J (mA/cm2) | EQE (%) | Voltage (V) | Radiant power (mW/cm2) | Wavelength (nm) |
|---|---|---|---|---|---|
| Example 1 | 50 | 0.8 | 3.8 | 0.72 | 720 |
| Comparative 1 | 50 | 0.2 | 2.9 | 0.2 | 732 |

Device Examples 2-5

Devices were prepared as described for Device Example 1, except that the light-emitting layer was as described in Table 5 and the electron-transporting layer was formed by spin-coating the electron-transporting layer without an n-dopant.

Host polymer:emitter polymer weight ratios in all examples was 9:1.

As shown in Table 5, EQE of each of Device Examples 2-5 in which the light emitting layer is a blend of a host polymer as described herein and Infrared Polymer 2 is much higher than that of Comparative Device 1 containing Infrared Polymer 2 only.

TABLE 5

| Device | Emissive layer | Emissive layer thickness (nm) | J (mA/cm$^2$) | EQE (%) | Voltage (V) | Radiant power (mW/cm$^2$) | Wavelength (nm) |
|---|---|---|---|---|---|---|---|
| Example 2 | Host Polymer 5: Infrared Polymer 2 | 50 | 50 | 0.53 | 3.86 | 0.45 | 725 |
| Example 3 | Host Polymer 5: Infrared Polymer 2 | 70 | 50 | 0.97 | 0.95 | 0.80 | 725 |
| Example 4 | Host Polymer 2: Infrared Polymer 2 | 50 | 50 | 1.93 | 3.13 | 1.72 | 719 |

TABLE 5-continued

| Device | Emissive layer | Emissive layer thickness (nm) | J (mA/cm$^2$) | EQE (%) | Voltage (V) | Radiant power (mW/cm$^2$) | Wavelength (nm) |
|---|---|---|---|---|---|---|---|
| Example 5 | Host Polymer 2: Infrared Polymer 2 | 70 | 50 | 1.99 | 3.25 | 1.73 | 719 |

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:

1. A fluorescent infrared emitting composition comprising a mixture of a first material and a second material wherein the first material is a fluorescent infrared material; the second material is a fluorescent material having a higher photoluminescent quantum yield (PLQY) and shorter peak wavelength than the first material; and wherein the first material comprises a repeat unit of formula I-A, I-B or I-C:

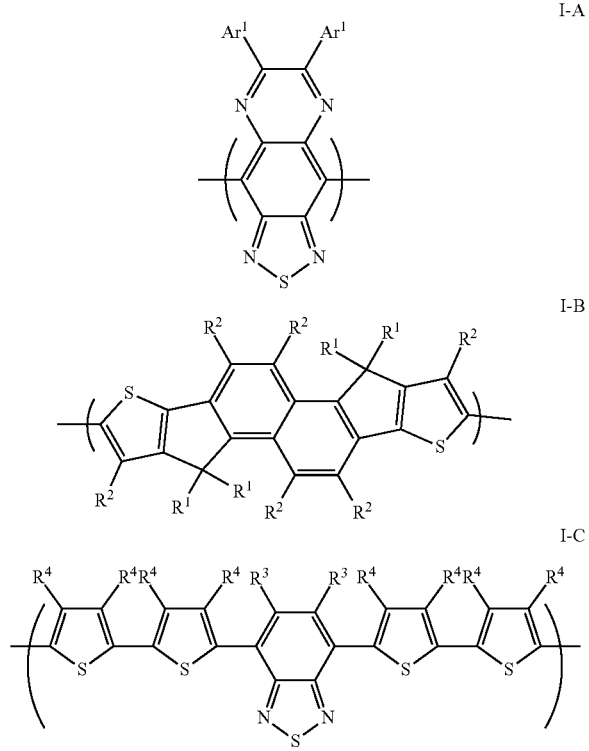

wherein $Ar^1$ is a $C_{6-20}$ aryl group or a 5-20 membered heteroaryl group which is unsubstituted or substituted with one or more substituents; $R^1$ in each occurrence is a substituent and the two groups $R^1$ may be linked to form a ring; and $R^2$, $R^3$ and $R^4$ independently in each occurrence is H or a substituent.

2. A fluorescent infrared emitting composition according to claim 1 wherein the first material has a photoluminescent peak in the range of 700 nm up to about 950 nm.

3. A fluorescent infrared emitting composition according to claim 1 wherein the first and/or second material is a polymer.

4. A fluorescent infrared emitting composition according to claim 1 wherein the second material has a photoluminescent peak in the range of 400-680 nm.

5. A fluorescent infrared emitting composition according to claim 1 wherein the first material : second material weight ratio is in the range of about 99:1-60:40.

6. A fluorescent infrared emitting composition according to claim 1 wherein the difference in PLQY of the first and second materials is at least 20%.

7. A fluorescent infrared emitting composition according to claim 1 wherein the difference in peak wavelengths of the first and second materials is no more than about 250 nm.

8. A solution comprising a composition according to claim 1 dissolved in one or more solvents.

9. An organic light-emitting device comprising an anode, a cathode and a light-emitting layer between the anode and cathode wherein the light-emitting layer comprises a composition according to claim 1.

10. A method of forming an organic light-emitting device according to claim 9 comprising the step of depositing the light-emitting layer over one of the anode and cathode, and depositing the other of the anode and cathode over the light-emitting layer.

11. A method according to claim 10 wherein the light-emitting layer is formed by depositing a solution and evaporating the one or more solvents.

* * * * *